US007412019B2

(12) United States Patent
Kuo

(10) Patent No.: US 7,412,019 B2
(45) Date of Patent: Aug. 12, 2008

(54) SPREAD SPECTRUM CLOCK GENERATOR

(75) Inventor: Ting-Fu Kuo, GuanMiao Township, Tainan County (TW)

(73) Assignee: Faraday Technology Corp., Hsin-Chu (TW)

( * ) Notice: Subject to any disclaimer, the term of this patent is extended or adjusted under 35 U.S.C. 154(b) by 760 days.

(21) Appl. No.: 10/903,320

(22) Filed: Jul. 30, 2004

(65) Prior Publication Data

US 2006/0023770 A1 Feb. 2, 2006

(51) Int. Cl.
*H03D 3/24* (2006.01)

(52) U.S. Cl. ....................... 375/373; 375/376; 327/147; 327/156

(58) Field of Classification Search ................. 375/371, 375/373–376; 327/146–148, 150, 151, 154–157, 327/159, 160

See application file for complete search history.

(56) References Cited

U.S. PATENT DOCUMENTS 6,104,222 A * 8/2000 Embree ...................... 327/156
6,515,553 B1 * 2/2003 Filiol et al. ................. 332/127
7,012,470 B2 * 3/2006 Suzuki et al. ................. 331/16
7,039,149 B2 * 5/2006 Tagami ....................... 375/376
7,042,258 B2 * 5/2006 Booth et al. ................ 327/115
7,203,262 B2 * 4/2007 Moy et al. .................. 375/376

* cited by examiner

*Primary Examiner*—Dac V. Ha
(74) *Attorney, Agent, or Firm*—Winston Hsu

(57) ABSTRACT

A spread spectrum clock generator comprising a phase-locked loop circuit and a modulation circuit. The phase-locked loop circuit receives a reference signal at a reference frequency and outputs an output signal at an output frequency periodically varying in a range between upper predetermined boundary and lower predetermined boundary frequencies. The modulation circuit receives the reference and the output signals, controls a period of the output frequency according to the reference frequency, and modulates a variation rate of the output frequency according to the reference frequency, and the output frequency, and the predetermined integers.

18 Claims, 5 Drawing Sheets

30
300
pre-divider
302
phase detector
301
loop-divider
303
charge pump
304
filter
305
VCO
31
modulation curcuit
$S_{OUT}$
$S_{OUT}$
$S_{OUT}$
$SD_1$
$SD_2$
$SP_1$
$S_{SW}$
$S_{SW}$
$S_{REF}$
$S_{REF}$

SPREAD SPECTRUM CLOCK GENERATOR

BACKGROUND

The present invention relates to a spread spectrum clock generator, and in particular to a spread spectrum clock generator for generating a signal whose frequency varies according to a desired profile and reducing the level of electromagnetic interference.

The demand for high-speed electronic equipment has created a number of problems for circuit designers and manufacturers. High-speed electronic equipment requires clocks that operate at relatively higher frequencies. Higher frequency operation, however, increases the level of electromagnetic interference (EMI). In addition, long traces of wire on printed circuit boards increase EMI levels. The increased level of EMI can negatively effect the operation of components in proximity to such high-speed circuitry due to the coupling of the radiated energy. Therefore, it is desirable to lower the unwanted EMI energy levels while increasing the speed of the electronic circuitry.

In the United States, the Federal Communications Commission (FCC) has established rules and standards regarding EMI emissions from electronic equipment. The EMI emission limitations are published in the Code of Federal Regulations. The FCC also enforces three standards and levies fines against violators. Compliance with the FCC standard has become quite a challenge for most circuit board manufacturers.

FIG. 1 is a spectral plot of energy versus frequency for an ideal clock. All the energy is concentrated at the clock frequency $F_c$. The plot also shows the FCC level. This clock exceeds that level. A well known technique to reduce the peak energy is to spread the spectrum of the clock. This technique is used, for example, in spread spectrum radio. By spreading the clock energy over a broader frequency band, no peak exceeds the FCC level, as shown in FIG. 2.

Currently, spread-spectrum clock generators are used to spread a spectrum of a clock signal. According to an embodiment of the present invention, a spread-spectrum clock generator is used to provide a finely controlled clock signal frequency thus minimizing EMI levels thereof.

SUMMARY

Accordingly, an object of embodiments of the present invention is to provide a spread spectrum clock generator that ameliorates disadvantages of the related art.

According to the above described object, an embodiment of the present invention provides a spread spectrum clock generator comprising a phase-locked loop circuit and a modulation circuit. The phase-locked loop circuit receives a reference signal at a reference frequency and outputs an output signal at an output frequency periodically varying in a range between upper boundary and lower boundary frequencies. The modulation circuit receives the reference and the output signals, controls a period of the output frequency according to the reference frequency, and modulates a variation rate of the output frequency according to the reference and the output frequencies and the predetermined integers.

A detailed description is given in the following embodiments with reference to the accompanying drawings.

BRIEF DESCRIPTION OF THE DRAWINGS

Various aspects of embodiments of the present invention can be more fully understood by reading the subsequent detailed description and examples with references made to the accompanying drawings, wherein.

DETAILED DESCRIPTION

Figure 1:
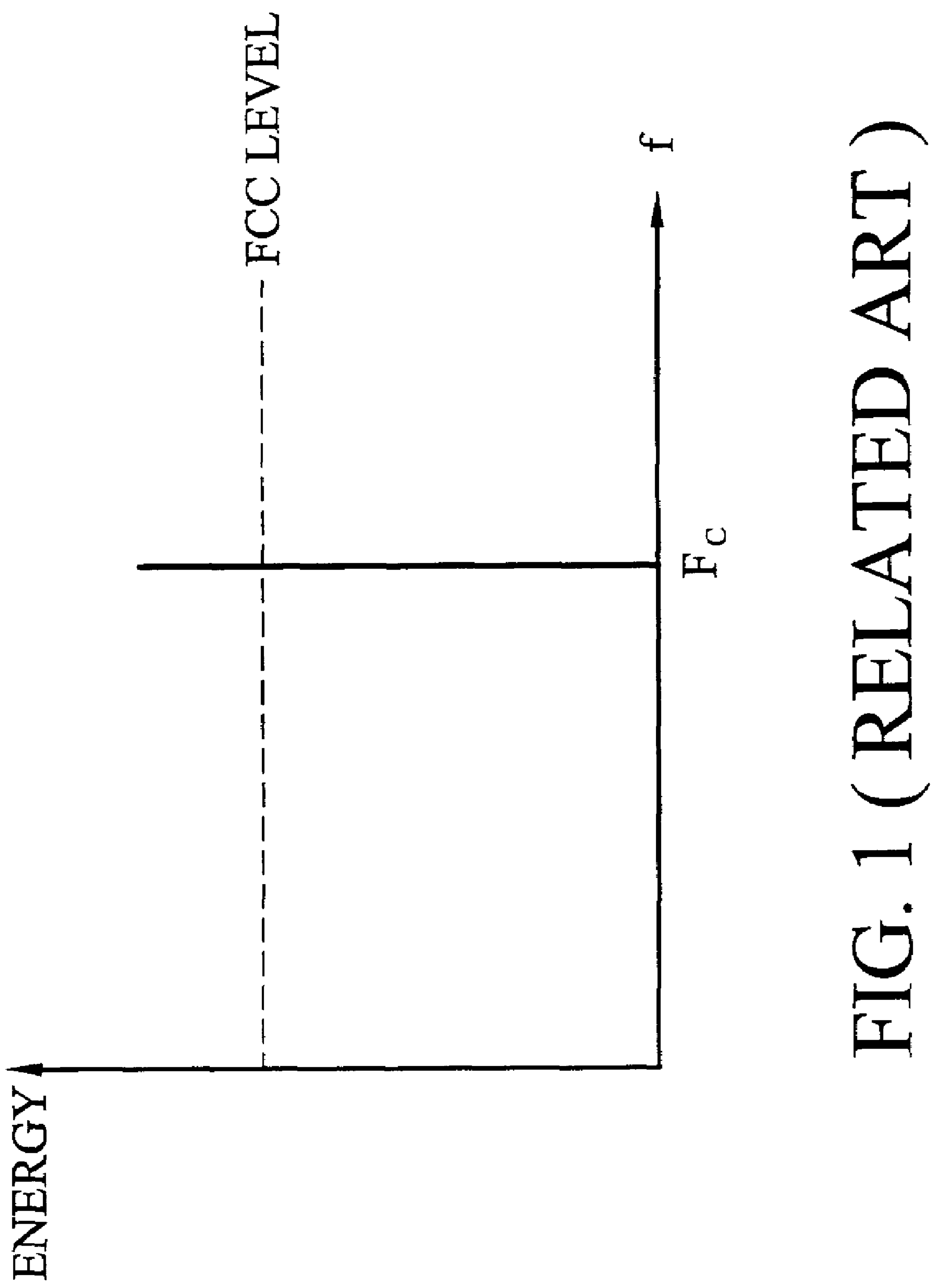
FIG. 1 is a graph illustrating the energy levels of an exemplary clock signal.
Figure 2:
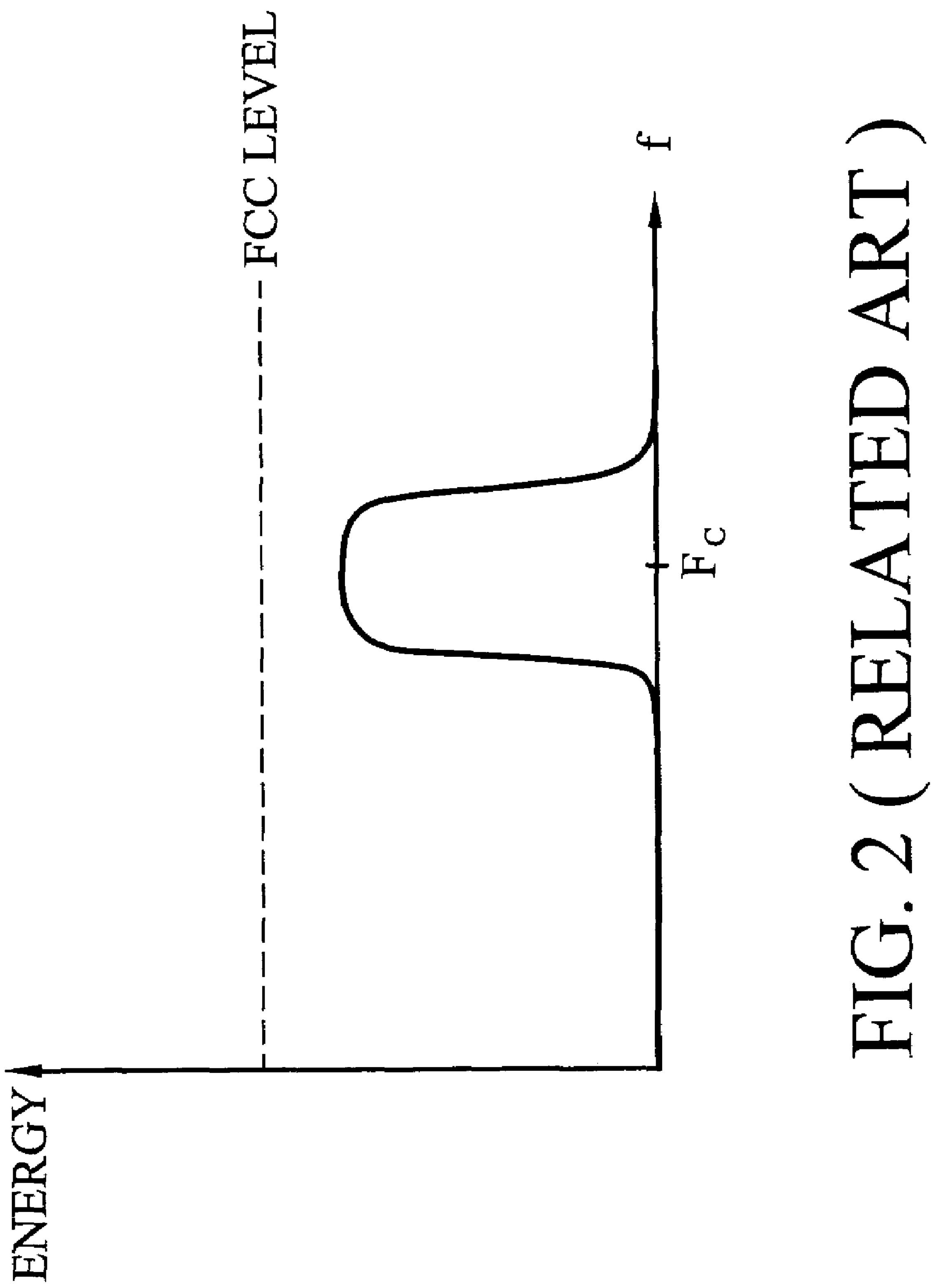
FIG. 2 is a graph illustrating the energy level of a frequency modulated version of the clock signal shown in FIG. 1.
Figure 3:
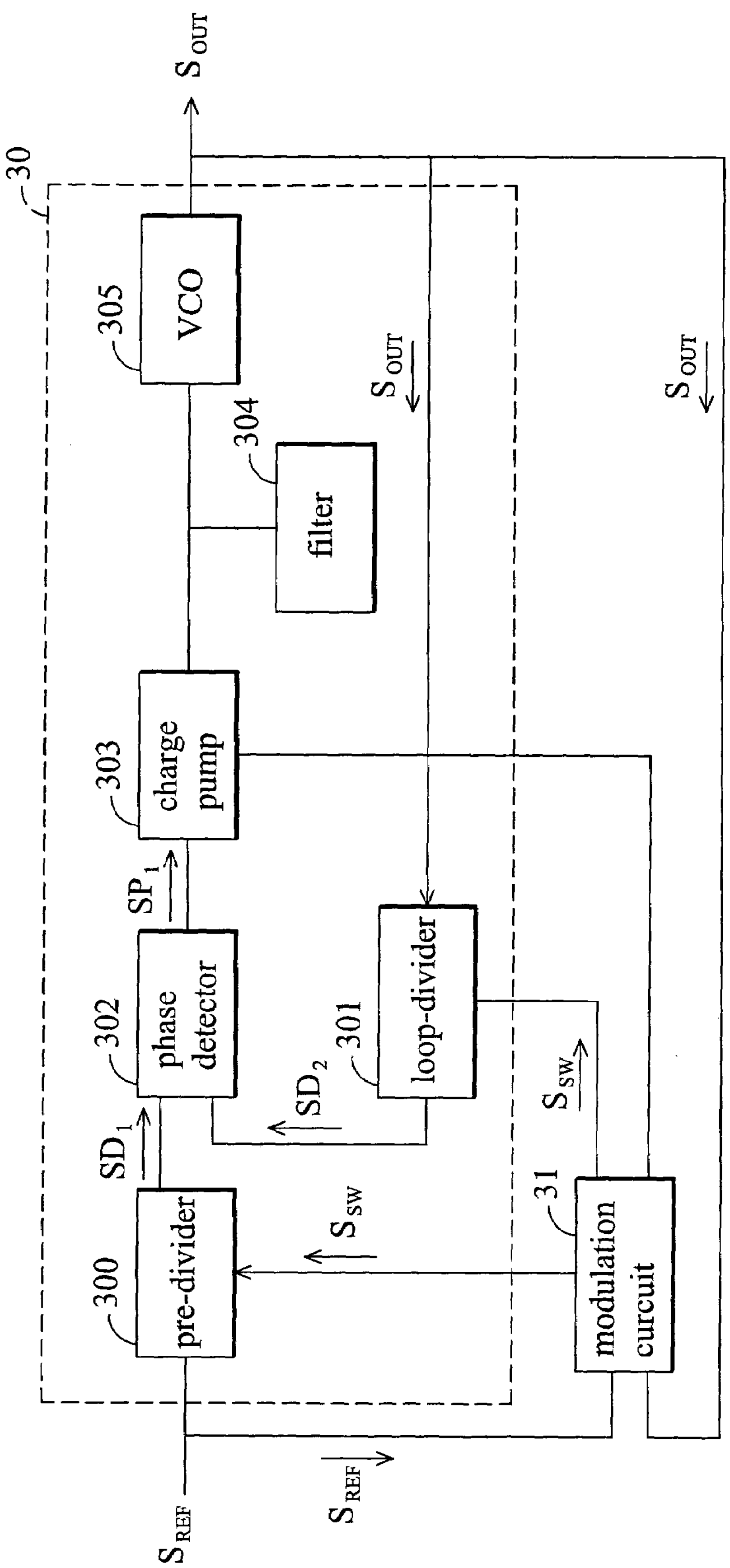
FIG. 3 is a block diagram of a spread-spectrum clock generator according an embodiment of the present invention.

FIG. 3 is a block diagram of a spread-spectrum clock generator according an embodiment of the present invention. The spread-spectrum clock generator 3 comprises a phase-locked loop (PLL) circuit 30 and a modulation circuit 31. The PLL circuit 30 comprising a pre-divider 300, a loop-divider 301, a phase detector 302, a charge pump 303, a filter 304, and a voltage controlled oscillator (VCO) 305. The PLL circuit 30 receives a reference signal $S_{REF}$ with a reference frequency $F_{REF}$ and outputs an output signal $S_{OUT}$ with an output frequency $F_{OUT}$. The pre-divider 300 receives the reference signal $S_{REF}$ and generates a divided signal $SD_1$ for every M pulses on the reference signal $S_{REF}$, that is, the reference frequency $F_{REF}$ is divided by an integer M.

The loop-divider receives the output signal $S_{OUT}$ and generates a divided signal $SD_2$ for every N pulses on the output signal $S_{OUT}$. The phase detector 302 detects the phases of the divided signals $SD_1$ and $SD_2$ and outputs a pump signal $SP_1$ indicative of a difference between those two signals. The charge pump 303 varies a control voltage stored in the filter 304 according to the pump signal $SP_1$. The voltage controlled oscillator 305 generates the output signal $S_{OUT}$ with the output frequency $F_{OUT}$. In order to spreading the reference frequency $F_{REF}$ over a predetermined frequency band, the integer M can be M1 or M2 and the integer N can be N1 or N2.

The modulation circuit 31 generates a switch signal $S_{SW}$ to the pre-divider 300 and loop-divider 301 according the reference signal $S_{REF}$ and the output signal $S_{OUT}$ to switch the integers M and N respectively. When the integers M and N are switched to M1 and N1 respectively, the charge pump 303 begins to raise the control voltage according to the pump signal $SP_1$ at a variation rate, such that, the output frequency $F_{OUT}$ of the output signal $S_{OUT}$ increases toward a maximum frequency $F_{MAX}$ continuously. When the integers M and N are switched to M2 and N2 respectively, the charge pump 303 begins to lower the control voltage according to the pump signal $SP_1$, such that, the output frequency $F_{OUT}$ of the output signal $S_{OUT}$ decreases toward a minimum frequency $F_{MIN}$ continuously.

Figure 4:
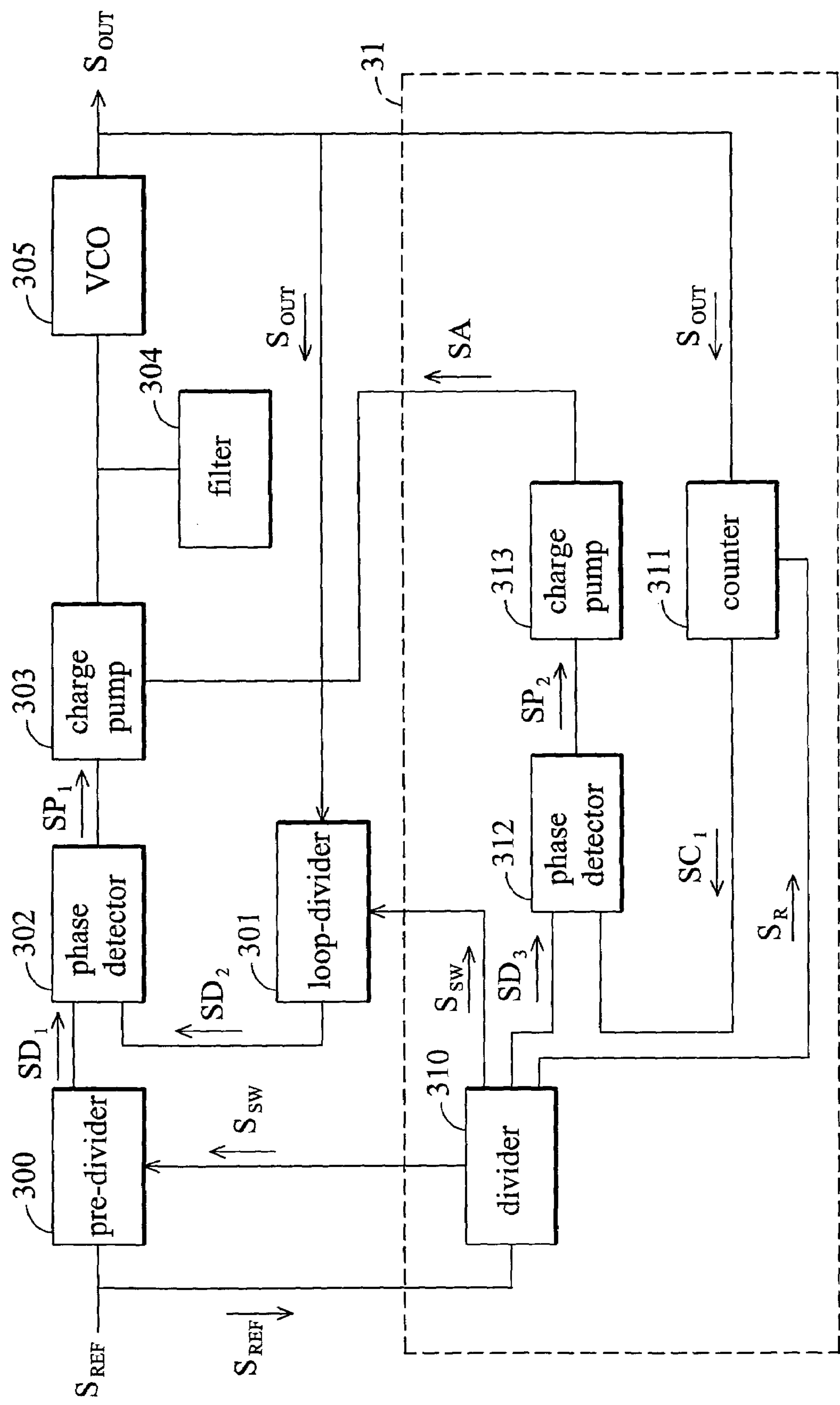
FIG. 4 is a detail diagram of the modulation circuit according to the embodiment of the present invention.
Figure 5:
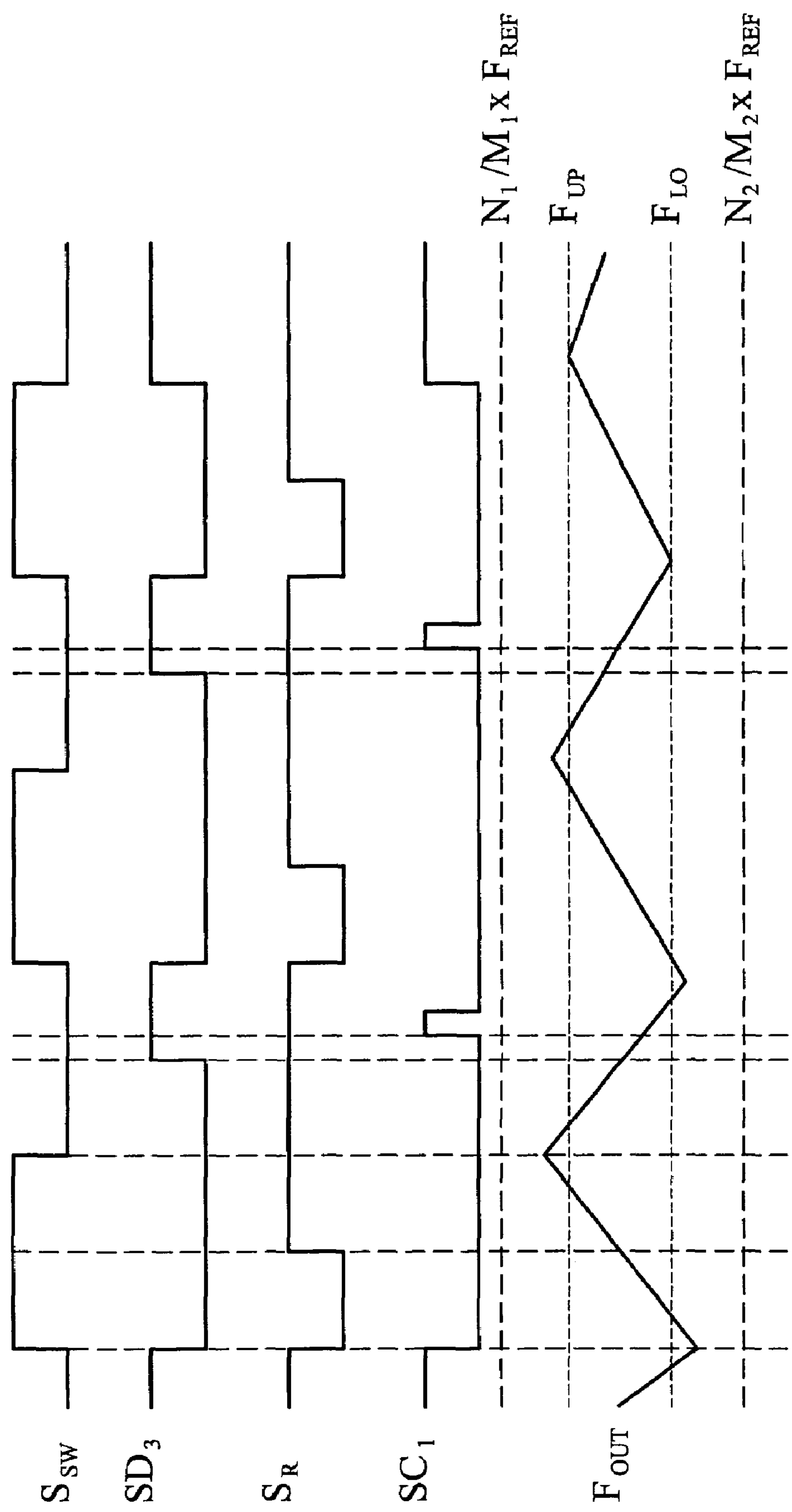
FIG. 5 is an operation timing chart of the modulation circuit.

FIG. 4 is a detail diagram of the modulation circuit according to the embodiment of the present invention. The modulation circuit 31 comprises a divider 310, a counter 311, a phase detector 312, and a charge pump 313. FIG. 5 is an operation timing chart of the modulation circuit. The operation of the modulation circuit 31 is described with FIGS. 4 and 5. The divider 310 receives the reference signal $S_{REF}$ and divides the reference frequency $F_{REF}$ by an integer P for generating switch signal $S_{SW}$, which determines the modulation period of the output frequency $F_{OUT}$.

At the rising-edge of the switch signal $S_{SW}$, the switch signal $S_{SW}$ controls the pre-divider 300 to switch the integers M to M1 and the loop-divider 301 to switch the integers N to N1. When the voltage level of the switch signal $S_{SW}$ stays high, the output frequency $F_{OUT}$ of the output signal $S_{OUT}$ begins to increase continuously toward a maximum frequency $F_{MAX}$. The maximum frequency $F_{MAX}$ is given by:

$$F_{MAX} = \frac{N1}{M1} \times F_{REF}$$

At the falling-edge of the switch signal $S_{SW}$, the switch signal $S_{SW}$ controls the pre-divider 300 to switch the integers M to M2 and the loop-divider 301 to switch the integers N to N2. When the voltage level of the switch signal $S_{SW}$ stays low, the output frequency $F_{OUT}$ of the output signal $S_{OUT}$ begins to decrease continuously toward a minimum frequency $F_{MIN}$. The minimum frequency $F_{MIN}$ is given by:

$$F_{MIN} = \frac{N2}{M2} \times F_{REF}$$

Moreover, the divider 310 also generates a divided signal $SD_3$ and a reset signal $S_R$ according to the reference signal $S_{REF}$. The counter 311 is reset by a low level of the reset signal $S_R$ and when the rising-edge of the reset signal $S_R$ is reached, the counter 311 begins to count the output signal $S_{OUT}$ by a predetermined integer R to generate a counted signal $SC_1$, that indicates the average frequency of the upper half triangle.

The phase detector 312 detects the rising-edges of phases of the divided signal $SD_3$ and the counted signal $SC_1$ and outputs a pump signal $SP_2$ indicative of a difference between those two signals. When the divided signals $SD_3$ runs faster than the counted signal $SCD_1$, the charge pump 313 outputs an adjustment signal SA according to the pump signal $SP_2$, which increases the current of the charge pump 303, to widen the bandwidth of phase locked loop. Thus, the modulation percentage of the output frequency $F_{OUT}$ also is increased. When the divided signals $SD_3$ runs slower than the counted signals $SCD_1$, the charge pump 313 outputs the adjustment signal SA according to the pump signal $SP_2$, which decreases the current of the charge pump 303, to narrow the bandwidth of phase locked loop. Thus, the modulation percentage of the output frequency $F_{OUT}$ also is decreased.

Referring to the FIG. 5, the difference between the divided signal $SD_3$ and the counted signal $SC_1$ gradually becomes small by repeating adjustment of the current of the charge pump 303. The output frequency $F_{OUT}$ is controlled to vary between an upper frequency $F_{UP}$ and a lower frequency $F_{LO}$ finally.

The center frequency $F_{CEN}$ is given by:

$$F_{CEN} = \frac{1}{2}(F_{MAX} + F_{MIN}) = \frac{1}{2}\left(\frac{N1}{M1} + \frac{N2}{M2}\right) \times F_{REF} \quad (1)$$

The average frequency of the upper half of the output frequency $F_{OUT}$, $F_{MEAN}$, is given by:

$$F_{MEAN} = \frac{1}{2}(F_{UP} + F_{CEN}) \quad (2)$$

The modulation circuit will force the synchronization of the divider signal $SD_3$ and the counted signal $SC_1$.

It means that:

$$\frac{F_{REF}}{P} \times 2 = \frac{F_{MEAN}}{R} \quad (3)$$

According to Equation (1) to (3), the upper frequency $F_{UP}$ is given by:

$$F_{UP} = \frac{1}{2}\left(\frac{8R}{P} - \left(\frac{N1}{M1} + \frac{N2}{M2}\right)\right) \times F_{REF}$$

$$F_{LO} = 2 \times F_{CEN} - F_{UP} = \frac{1}{2}\left(\left(\frac{N1}{M1} + \frac{N2}{M2}\right) - \frac{8R}{P}\right) \times F_{REF}$$

In the embodiment of the present invention, the integers N, M, P, and R, and the predetermined integer are determined according the requirements of the system. The modulation period of the output frequency $F_{OUT}$ is controlled by the divider 310 with the integer P according to the reference frequency $F_{REF}$. The modulation percentage of the output frequency $F_{OUT}$ is controlled according to the integers N, M, P, and R, the reference frequency $F_{REF}$ and the output frequency $F_{OUT}$. Therefore, the output frequency $F_{OUT}$ varies following a desired profile by repeating the operation of the spread-spectrum clock generator.

Finally, while the invention has been described by way of example and in terms of the above, it is to be understood that the invention is not limited to the disclosed embodiment. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A spread spectrum clock generator, comprising:

a phase-locked loop circuit receiving a reference signal at a reference frequency and outputting an output signal at an output frequency periodically varying in a range between a maximum and a minimum frequencies; and a modulation circuit receiving the reference and the output signals, controlling a modulation period of the output frequency according to the reference frequency, and controlling the modulation percentage of the output frequency according to the reference and the output frequencies.

2. The spread spectrum clock generator as claimed in claim 1, wherein the modulation circuit comprises:

a first divider receiving the reference signal, dividing the reference frequency for generating a switch signal, and outputting a first divided signal and a reset signal according to the reference frequency, wherein a period of the switch signal is equal to the modulation period of the output frequency;

a counter receiving the reset signal and counting the output frequency according to the reset signal for generating a counted signal;

a first phase detector receiving the first divided signal and the counted signal and outputting a first pump signal indicative of a difference between the first divided signal and the counted signal; and a first charge pump coupled to the first phase detector and outputting a control signal to control the modulation percentage of the output frequency according to the first pump signal.

3. The spread spectrum clock generator as claimed in claim 2, wherein the output frequency increases continuously when the switch is at a first level, and the output frequency decreases continuously when the switch is at a second level.

4. The spread spectrum clock generator as claimed in claim 2, the phase-locked loop circuit comprising:

a second divider receiving the reference signal and dividing the reference frequency by a variable integer M according to the switch signal for generating a second divided signal;

a third divider receiving the output signal and dividing the output frequency by a variable integer N according to the switch signal for generating a third divided signal;

a second phase detector receiving the second and the third divided signal and outputting a second pump signal indicative of a difference between the second and the third divided signals;

a filter supplying a control voltage;

a second charge pump receiving the second pump signal and varying the control voltage according to the second pump signal, wherein a variation rate of the control voltage is determined by the control signal; and a voltage-controlled oscillator receiving the control voltage and outputting the output signal, wherein the output frequency varies according to the control voltage.

5. The spread spectrum clock generator as claimed in claim 4, wherein according to the switch signal, the variable integer M varies between integers M1 and N2 and the variable integer N varies between integers N1 and N2.

6. The spread spectrum clock generator as claimed in claim 5, wherein the maximum frequency is M1/N1 times the reference frequency and the minimum frequency is M2/N2 times the reference frequency.

7. A spread spectrum clock generator, comprising:

a phase-locked loop circuit receiving a reference signal at a reference frequency and outputting an output signal at an output frequency periodically varying in a range between a maximum and a minimum frequencies;

a first modulation circuit receiving the reference and the output signals and controlling a modulation period of the output frequency; and a second modulation circuit controlled by the first modulation to control a modulation percentage of the output frequency according to the reference and the output frequencies.

8. The spread spectrum clock generator as claimed in claim 7, wherein the first modulation circuit comprises a divider dividing the reference frequency for generating a switch signal, and outputting a first divided signal and a reset signal according to the reference frequency, wherein a period of the switch signal is equal to the modulation period of the output frequency.

9. The spread spectrum clock generator as claimed in claim 8, wherein the output frequency increases continuously when the switch is at a first level, and the output frequency decreases continuously when the switch is at a second level.

10. The spread spectrum clock generator as claimed in claim 8, wherein second modulation circuit comprises:

a counter receiving the reset signal and counting the output frequency according to the reset signal for generating a counted signal;

a first phase detector receiving the first divided signal and the counted signal and outputting a first pump signal indicative of a difference between the first divided signal and the counted signal; and a first charge pump coupled to the first phase detector and outputting a control signal to control the modulation percentage of the output frequency according to the first pump signal.

11. The spread spectrum clock generator as claimed in claim 10, the phase-locked loop circuit comprising:

a second divider receiving the reference signal and dividing the reference frequency by a variable integer M according to the switch signal for generating a second divided signal;

a third divider receiving the output signal and dividing the output frequency by a variable integer N according to the switch signal for generating a third divided signal;

a second phase detector receiving the second and the third divided signal and outputting a second pump signal indicative of a difference between the second and the third divided signals;

a filter supplying a control voltage;

a second charge pump receiving the second pump signal and varying the control voltage according to the second pump signal, wherein a variation rate of the control voltage is determined by the control signal; and a voltage-controlled oscillator receiving the control voltage and outputting the output signal, wherein the output frequency varies according to the control voltage.

12. The spread spectrum clock generator as claimed in claim 11, wherein according to the switch signal, the variable integer M varies between integers M1 and N2 and the variable integer N varies between integers N1 and N2.

13. The spread spectrum clock generator as claimed in claim 12, wherein the maximum frequency is M1/N1 times the reference frequency and the minimum frequency is M2/N2 times the reference frequency.

14. A spread spectrum clock generator, comprising:

a phase-locked loop circuit receiving a reference signal at a reference frequency and outputting an output signal at an output frequency periodically varying in a range between a maximum and a minimum frequencies;

a first divider receiving the reference signal, dividing the reference frequency for generating a switch signal, and outputting a first divided signal and a reset signal according to the reference frequency, wherein a period of the switch signal is equal to the modulation period of the output frequency;

a counter receiving the reset signal and counting the output frequency according to the reset signal for generating a counted signal;

a first phase detector receiving the first divided signal and the counted signal and outputting a first pump signal indicative of a difference between the first divided signal and the counted signal; and a first charge pump coupled to the first phase detector and outputting a control signal to control the modulation percentage of the output frequency according to the first pump signal.

15. The spread spectrum clock generator as claimed in claim 14, wherein the output frequency increases continuously when the switch is at a first level, and the output frequency decreases continuously when the switch is at a second level.

16. The spread spectrum clock generator as claimed in claim 14, the phase-locked loop circuit comprising:

a second divider receiving the reference signal and dividing the reference frequency by a variable integer M according to the switch signal for generating a second divided signal;

a third divider receiving the output signal and dividing the output frequency by a variable integer N according to the switch signal for generating a third divided signal;

a second phase detector receiving the second and the third divided signal and outputting a second pump signal indicative of a difference between the second and the third divided signals;

a filter supplying a control voltage;

a second charge pump receiving the second pump signal and varying the control voltage according to the second pump signal, wherein a variation rate of the control voltage is determined by the control signal pump; and a voltage-controlled oscillator receiving the control voltage and outputting the output signal, wherein the output frequency varies according to the control voltage.

17. The spread spectrum clock generator as claimed in claim 16, wherein according to the switch signal, the variable integer M varies between integers M1 and N2 and the variable integer N varies between integers N1 and N2.

18. The spread spectrum clock generator as claimed in claim 17, wherein the maximum frequency is M1/N1 times the reference frequency and the minimum frequency is M2/N2 times the reference frequency.

* * * * *